United States Patent
Lin et al.

(10) Patent No.: US 9,063,171 B2
(45) Date of Patent: Jun. 23, 2015

(54) PROBING APPARATUS EQUIPPED WITH HEATING DEVICE

(71) Applicant: MPI CORPORATION, Chu-Pei, Hsinchu Shien (TW)

(72) Inventors: Hsiu-Wei Lin, Chu-Pei (TW); Yu-Che Cheng, Chu-Pei (TW); Hung-Yi Lin, Chu-Pei (TW)

(73) Assignee: MPI Corporation, Hsinchu Shien (TW)

( * ) Notice: Subject to any disclaimer, the term of this patent is extended or adjusted under 35 U.S.C. 154(b) by 89 days.

(21) Appl. No.: 13/836,254

(22) Filed: Mar. 15, 2013

(65) Prior Publication Data

US 2013/0249579 A1    Sep. 26, 2013

(30) Foreign Application Priority Data

Mar. 23, 2012  (TW) ............................. 101205343 U

(51) Int. Cl.
| | |
|---|---|
| *G01R 31/00* | (2006.01) |
| *G01R 1/04* | (2006.01) |
| *G01R 31/28* | (2006.01) |
| G01R 31/01 | (2006.01) |
| G01R 31/26 | (2014.01) |

(52) U.S. Cl.
CPC .............. *G01R 1/0408* (2013.01); *G01R 31/01* (2013.01); *G01R 31/2635* (2013.01); *G01R 31/2642* (2013.01); *G01R 31/2875* (2013.01)

(58) Field of Classification Search
CPC ........... G01R 31/2891; G01R 31/2875; G01R 31/2635

USPC ........................... 324/750.13, 750.03–750.04
See application file for complete search history.

(56) References Cited

U.S. PATENT DOCUMENTS

| | | | | |
|---|---|---|---|---|
| 5,124,639 | A * | 6/1992 | Carlin et al. ............. | 324/750.03 |
| 5,847,293 | A * | 12/1998 | Jones ............................ | 73/865.8 |
| 6,137,303 | A * | 10/2000 | Deckert et al. ........... | 324/757.03 |
| 6,304,093 | B1 * | 10/2001 | Hilmoe et al. ........... | 324/750.13 |
| 7,675,306 | B2 * | 3/2010 | Janusch ................... | 324/750.06 |
| 8,432,176 | B2 * | 4/2013 | Gunji et al. .............. | 324/750.03 |
| 2002/0050834 | A1 * | 5/2002 | Olsen et al. .................... | 324/760 |
| 2006/0033519 | A1 * | 2/2006 | Sugiyama et al. ............ | 324/760 |
| 2008/0116925 | A1 * | 5/2008 | Sunohara et al. ............. | 324/761 |
| 2009/0239316 | A1 * | 9/2009 | Li .................................... | 438/17 |
| 2010/0134130 | A1 * | 6/2010 | Lou et al. ....................... | 324/760 |
| 2010/0164520 | A1 * | 7/2010 | Kiyofuji et al. ............... | 324/754 |
| 2013/0113509 | A1 * | 5/2013 | Wu et al. .................. | 324/750.03 |

\* cited by examiner

*Primary Examiner* — Patrick Assouad
*Assistant Examiner* — Demetrius Pretlow
(74) *Attorney, Agent, or Firm* — Muncy, Geissler, Olds & Lowe, P.C.

(57) ABSTRACT

A probing apparatus includes a rotating device having a plurality of platforms for supporting DUTs, a probe device having a lifting stage movable between first and second positions, and a heating device mounted to the lifting stage so as to move along with it. The platforms are synchronously revolvable in a way that the platforms move to a test position sequentially The heating device is configured in a manner that when the lifting stage moves to the first position, the heating device is located away from the platform at the test position, and when the lifting stage moves to the second position, the heating device contacts and heats the platform at the test position. Therefore, the heating device and the probe device are movable simultaneously for heating up the platform and testing the DUT respectively.

20 Claims, 7 Drawing Sheets

PROBING APPARATUS EQUIPPED WITH HEATING DEVICE

BACKGROUND OF THE INVENTION

1. Field of the Invention

The present invention relates generally to apparatus for testing properties of semiconductor chips, such as light emitting diode (hereinafter referred to as "LED") chips, and more particularly to a probing apparatus equipped with a heating device for heating chips under test.

2. Description of the Related Art

In a task of testing properties of semiconductor chips, such as LED chips, the step of testing the thermal resistance to high temperature of the chips is usually included. For running the thermal resistance test, the conventional probing apparatus is usually equipped with a heating device for heating chips under test. Such conventional probing apparatus is usually composed of a rotating device having a plurality of platforms for supporting devices under test (hereinafter referred to as "DUTs"), a heating device mounted in the rotating device and provided with a plurality of electrical heaters attached to the platforms, and a probe device. The heaters are used to heat the platforms respectively, such that the DUTs supported on the platforms can be indirectly heated by the heaters to a desired temperature, e.g. 80 to 90 degrees centigrade, qualified for running the thermal resistance test. In addition, the rotating device is used to sequentially move the platforms to a test position, which corresponds in location to the probe device, by a revolving motion, such that the DUTs having been heated to the desired temperature can be tested by the probe device one after another.

In order to achieve the function that the heaters of the heating device are fixed relative to the platforms respectively and will revolve along with the rotating device, the heating device in the conventional design needs to be equipped with a slip ring for electricity transmission to the heaters, and the heating device usually has a complicated arrangement of electric wires thereof. As a result, the electric wires of the heating device tend to break or bad electrical contacts may happen after the conventional probing apparatus undergoes a long period of working time. In other words, the conventional probing apparatus is still defective and need further improvement.

SUMMARY OF THE INVENTION

The present invention has been accomplished in view of the above-noted circumstances. It is an objective of the present invention to provide a probing apparatus equipped with a heating device, which can prevent the electric wires in the heating device from breaking when the probing apparatus works.

To attain the above objective, the present invention is provided with a probing apparatus which comprises a rotating device, a probe device and a heating device. The rotating device comprises a plurality of platforms for supporting DUTs. The platforms are synchronously revolvable in a way that the platforms move to a test position sequentially. The probe device is arranged at a location corresponding to the test position and comprises a lifting stage movable between a first position and a second position. The heating device is mounted to and moved along with the lifting stage of the probe device. The heating device is configured in such a way that the heating device is located away from the platform at the test position when the lifting stage moves to the first position, and the heating device contacts and heats the platform at the test position when the lifting stage moves to the second position.

As a result, the heating device is moved along with the probe device not with the rotating device so that the heating device can heat the platform at the test position and the probe device can test properties of the DUT on that platform at the same time, In the present invention, the heating device will not revolve along with the rothting device, so that the probing apparatus provided by the present invention doesn't need to be equipped with any slip ring; further, a complicated arrangement of electric wires for the heating device is also not required. As a result, the electric wires in the heating device does not tend to break when the probing apparatus of the present invention works.

Preferably, the aforesaid probing apparatus may further comprise a thermal sensor fixed relative to the lifting stage for sensing the temperature of the platform at the test position or the temperature of the DUT supported on the platform at the test position.

Preferably, the lifting stage may comprise a seat body, a buffering unit mounted to the seat body, and a connecting element mounted to the buffering unit; the connecting element is movable relative to the seat body vertically and resiliently through the buffering unit; the heating device is fixed to the connecting element.

Aforesaid buffering unit may be configured comprising a guiding pillar mounted to the seat body, a spring sleeved onto the guiding pillar, and a linear guide mounted to the seat body; the connecting element is mounted to the linear guide and provided with a stop portion abutting against an end of the spring.

Preferably, each platform may be configured having a top surface, a bottom surface and a through hole penetrating through the top surface and the bottom surface. The heating device may be configured having a top surface, a side surface and a receiving notch opened on the top and side surfaces thereof. The probe device may further comprise a prober mounted to the lifting stage and provided with a probe needle received in the receiving notch of the heating device. When the lifting stage moves to the second position, the bottom surface of the platform at the test position is contacted with the top surface of the heating device and the probe needle is inserted into the through hole of the platform at the test position.

Preferably, aforesaid probing apparatus may further comprise at least one auxiliary heating device mounted to the lifting stave. At least one of the platforms that is located away from the test position is contacted with the at least one auxiliary heating device when the lifting stage moves to the second position. More preferably, each platform that is located away from the test position is contacted with one auxiliary heating device individually when the lifting stage moves to the second position.

Preferably, the lifting stage may comprise an annular frame encircling the rotating device, and the heating device and the auxiliary heating device each are fixed to the annular frame.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
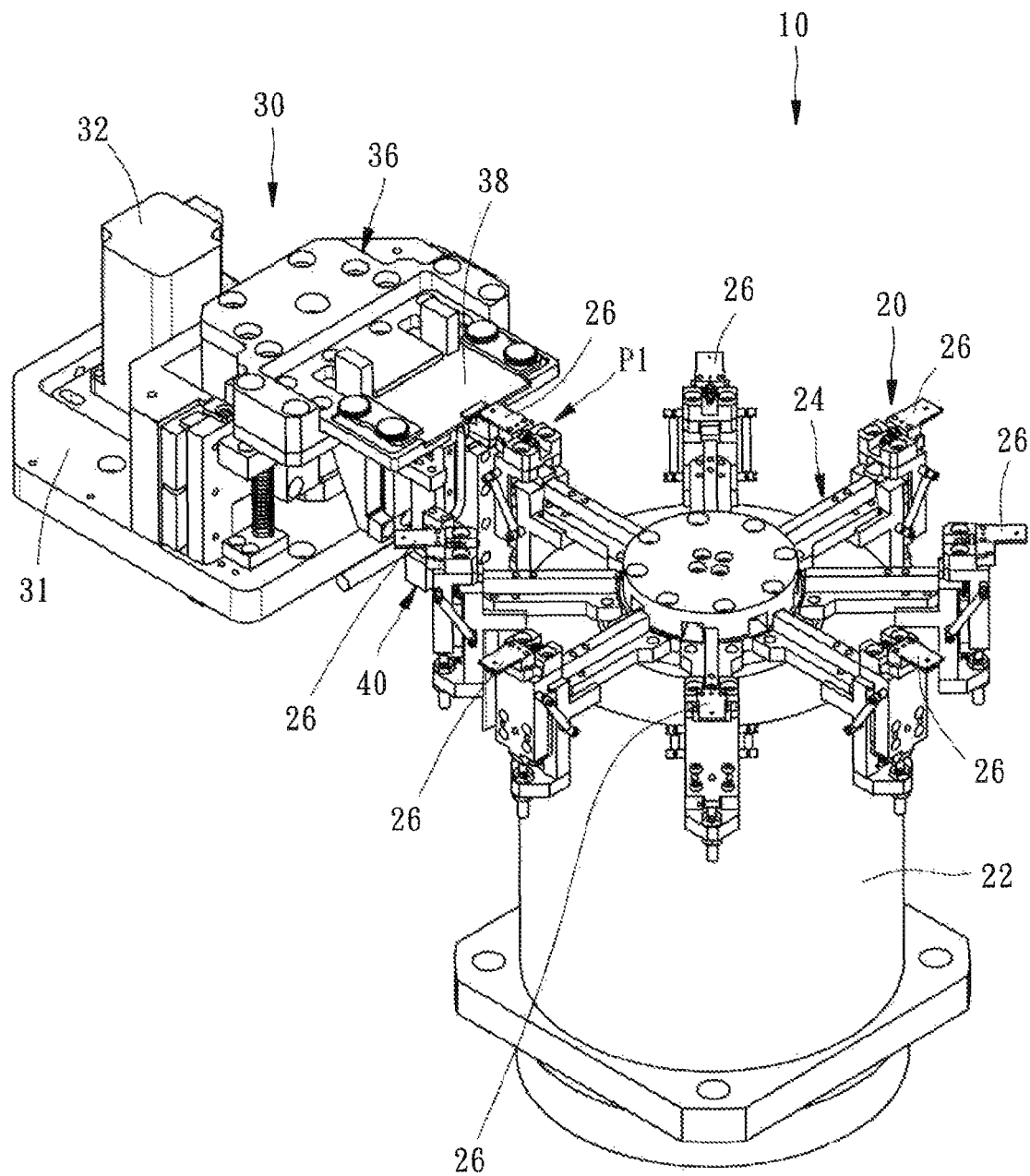
FIG. 1 is an assembled perspective view of a probing apparatus provided by a first preferred embodiment of the present invention.

First of all, it is to be mentioned that same reference numerals used in the following preferred embodiments and the appendix drawings designate same or similar elements throughout the specification for the purpose of concise illustration of the present invention.

Figure 2:
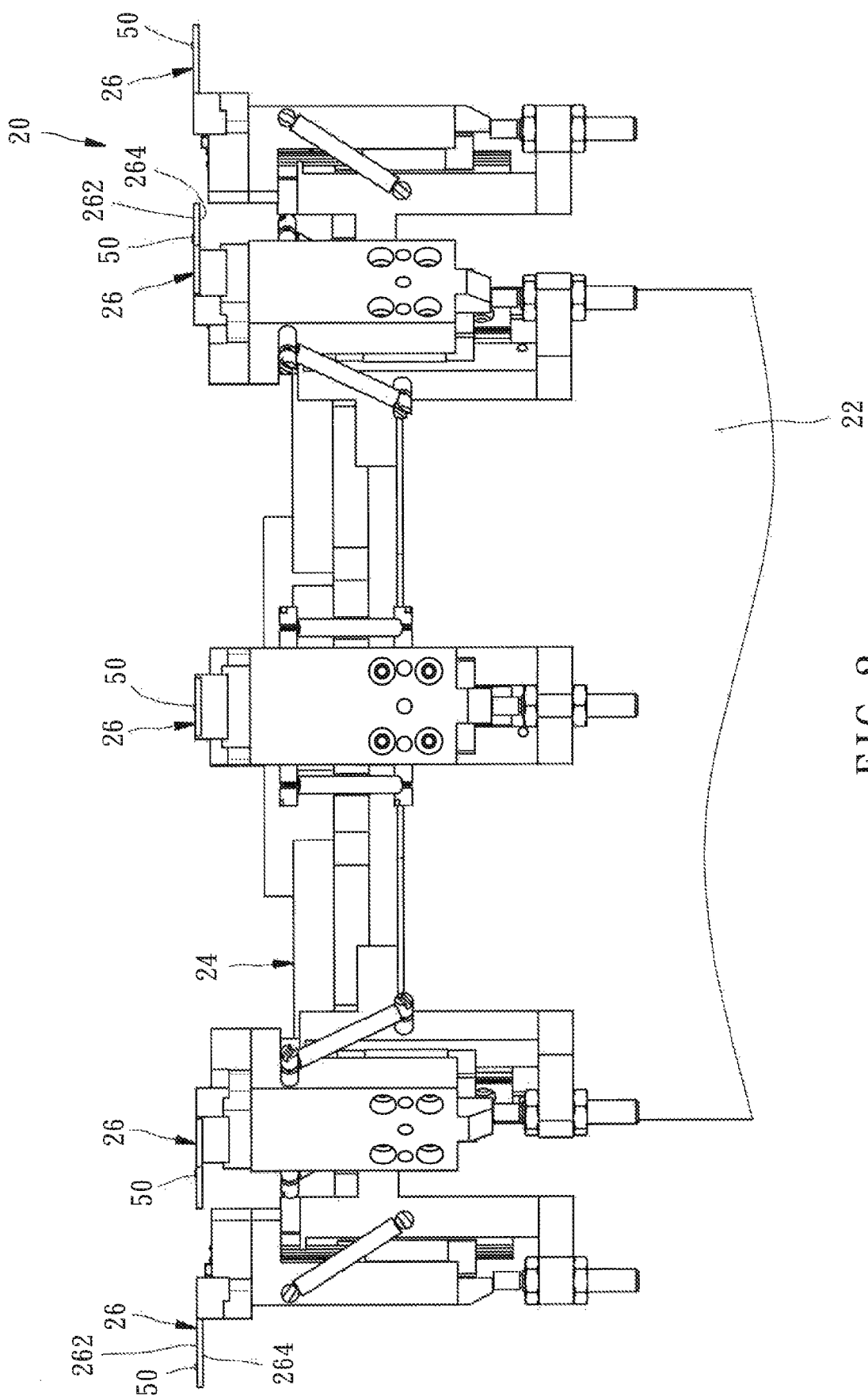
FIG. 2 is a front elevational view of a rotating device of the probing apparatus provided by the first preferred embodiment of the present invention; wherein a plurality of DUTs are supported on the rotating device.
Figure 3:
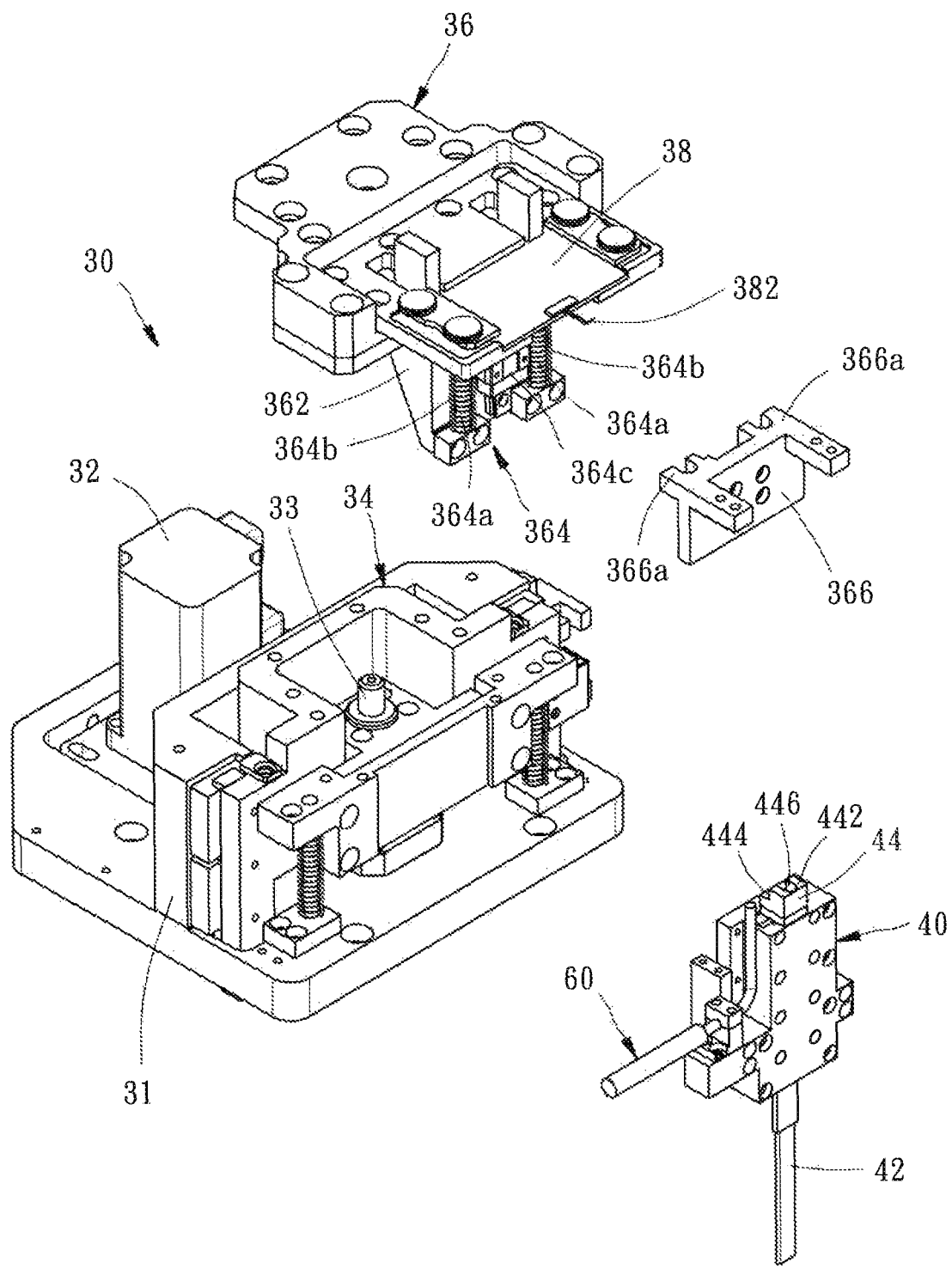
FIG. 3 is an exploded perspective view of a probe device, a heating device, and a thermal sensor of the probing apparatus provided by the first preferred embodiment of the present invention.

Referring to FIGS. 1-3, a probing apparatus 10 provided by a first preferred embodiment of the present invention comprises a rotating device 20, a probe device 30, and a heating device 40.

Figure 4:
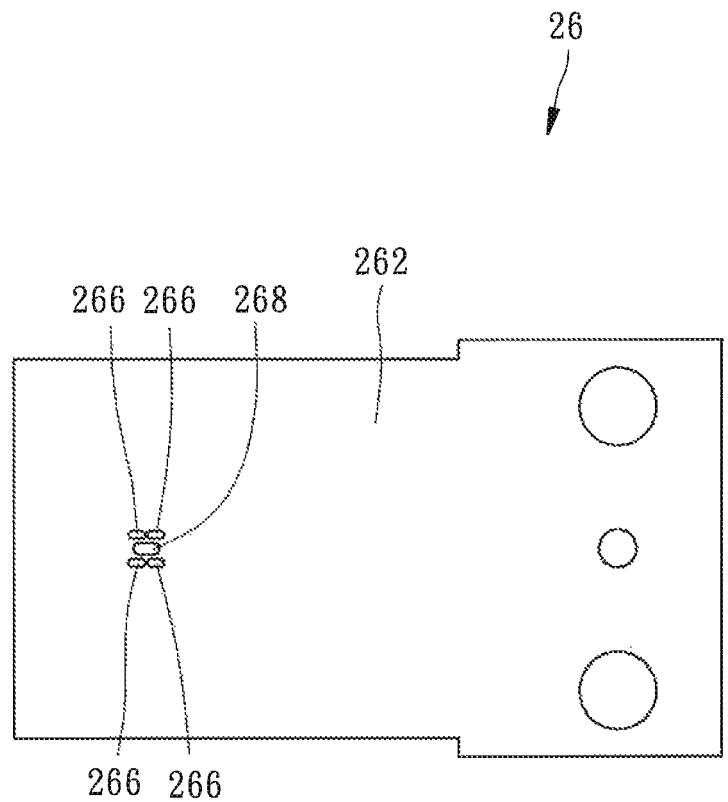
FIG. 4 is a top view of a platform of the rotating device of the probing apparatus provided by the first preferred embodiment of the present invention.

The rotating device 20 comprises a driver 22, a rotating frame 24 connected to and driven by the driver 22, and eight platforms 26 fixed to the rotating frame 24. Each platform 26 has a top surface 262, a bottom surface 264, four through holes 266 penetrating through the top and bottom surfaces 262 and 264, and a vacuum suction trough 268 provided inside the platform 26 and opened on the top surface 262, as shown in FIG. 4. Each platform 26 is adapted for supporting thereon a DUT 50 in a way that the DUT 50 is fixedly mounted on the platform 26 by vacuum suction and covered over the through holes 266. The driver 22, which is embodied as, but not limited to, a servo motor, is used to drive the rotating frame 24 to rotate intermittently, thereby intermittently driving the platforms 26 to revolve synchronously so that the platforms 26 are movable to a test position P1 as shown in FIG. 1 sequentially.

Figure 5:
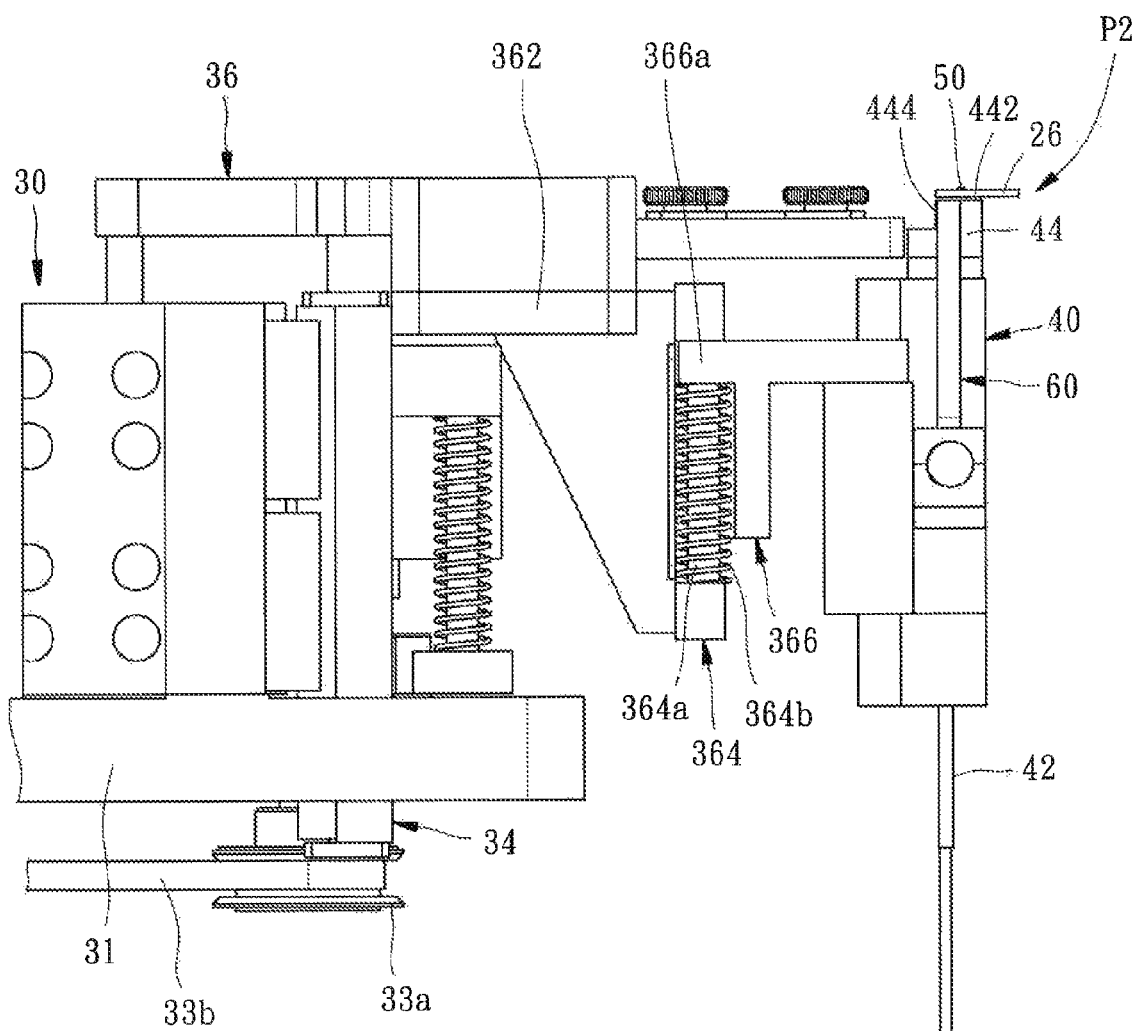
FIG. 5 is a partial front elevational view of the probing apparatus provided by the first preferred embodiment of the present invention, showing that a lifting stage is located at a first position.
Figure 6:
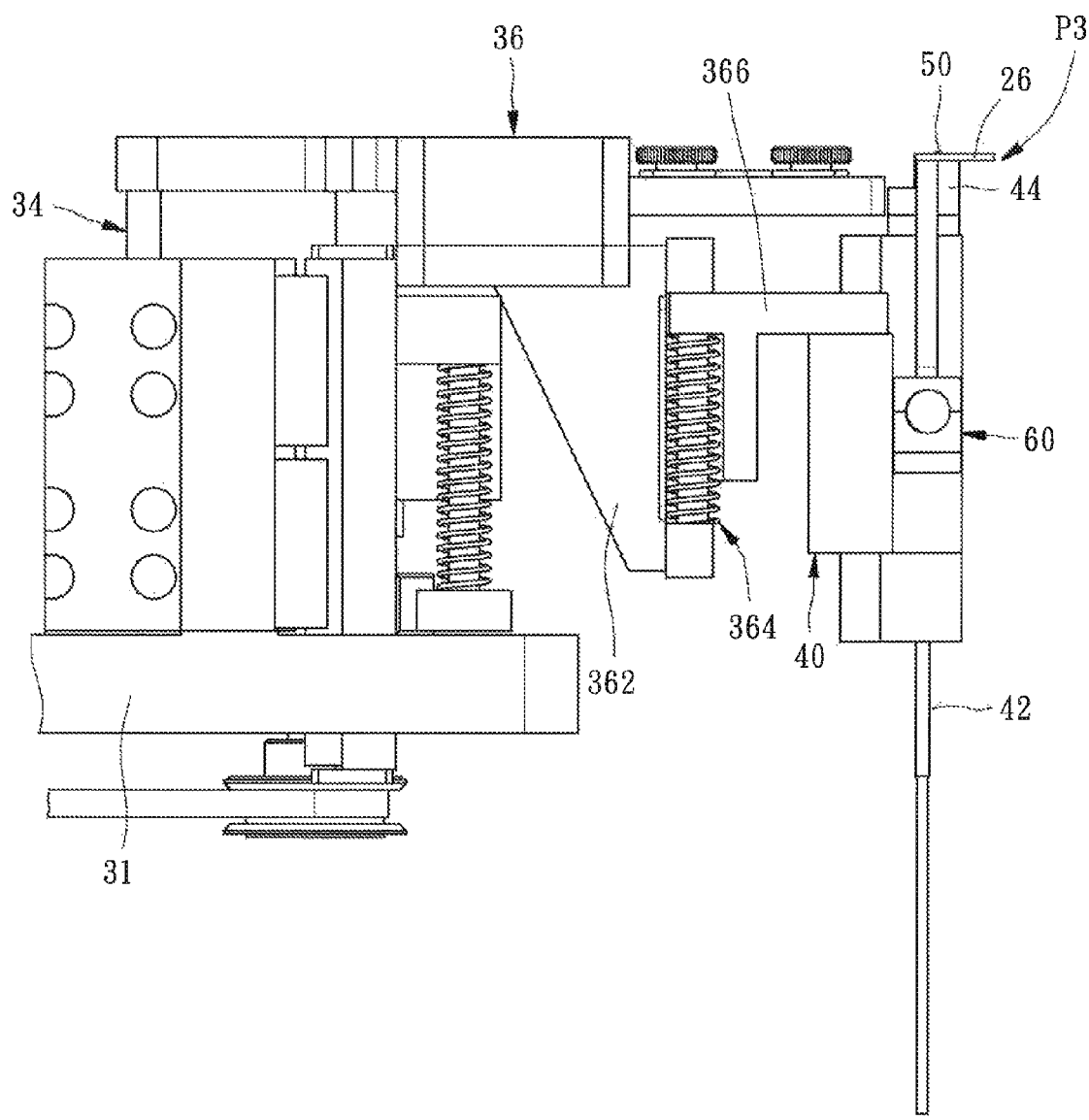
FIG. 6 is similar to FIG. 5 but showing that the lifting stage is located at a second position.

The probe device 30 is installed at a location corresponding to the test position P1. The probe device 30 comprises a stationary base 31, a driver 32 mounted to the stationary base 31, a screw 33 connected with and rotatably driven by the driver 32, a screw nut module 34 sleeved onto the screw 33 and driven by the screw 33 to vertically move along the screw 33, and a lifting stage 36 fixed to the screw nut module 34 such that the lifting stage 36 is moveable along with the screw nut module 34. The driver 32 may be embodied as, but not limited to, a servo motor. The driver 32 has an output shaft (not shown in the drawings) extending out of the bottom surface of the stationary base 31 and being connected with a pulley (not shown in the drawings) located under the bottom surface of the stationary base 31. The bottom end of the screw 33 is connected with another pulley 33a, as shown in FIG. 5, which is rotatably driven by the driver 32 through aforesaid pulley and a belt 33b running around the two pulleys, such that the screw 33 is rotatably driven by the driver 32 indirectly. As a result, the lifting stage 36 is vertically movable between a first position P2 as shown in FIG. 5 and a second position P3 as shown in FIG. 6 when the screw nut module 34 is driven by the screw 33, which is in turn driven by the driver 32, to move along the screw 33 down and up. The probe device 30 further comprises a prober 38 mounted to the lifting stage 36. The prober 38 can be, but not limited to, a probe card.

The heating device 40 is mounted to the lifting stage 36, comprising a ceramic heater 42 and a heat transfer element 44 connected with the ceramic heater 42. The heat transfer element 44 has a top surface 442, a side surface 444 facing the prober 38, and a receiving notch 446 opened on the top and side surfaces 442 and 444. The prober 38 comprises two probe needles 382 which are received in the receiving notch 446 and each have a tip extending out of the top surface 442 of the heat transfer element 44.

When any of the platforms 26 revolves to the test position P1, the lifting stage 36, which is indirectly driven by the driver 32, will be controlled by the driver 32 to move upwards from the first position P2 to the second position P3 to make the top surface 442 of the heating device 40 contact the bottom surface 264 of the platform 26 at the test position P1 so that the heating device 40 directly heats the platform 26 that is stayed at the test position, which in turn further heats the DUT 50 on that platform 26 for raising the temperature of the aforesaid DUT 50 to a predetermined value, 85 degrees centigrade for example if the DUT 50 is an LED chip. At the same time, the probe needles 382 of the prober 38 are inserted into two of the through holes 266 of the platform 26 at the test position P1 so as to contact the pads of the aforesaid heated DUT 50, thereby enabling the prober 38 to supply electricity to the aforesaid heated DUT 50 for running electrical properties testing. As a result, the properties of the DUT 50 under high temperature can be tested by the probing apparatus 10 of the present invention. After the step of testing the DUT 50 is completed, the lifting stage 36 will be controlled by the driver 32 to move downward from the second position P3 to the first position P2; as soon as the probe needles 382 leave away from the platform at the test position P1, the rotating frame 24 will be controlled by the driver 22 to rotate until a next platform 26 revolves to the test position P1; thereafter, the probe device 30 will execute aforesaid heating and testing process again. It will be appreciated that the amount and positions of the through holes 266 of each platform 26 are not limited to those illustrated in this preferred embodiment and can be designed according to the amount and positions of the probe needles 382 of the prober 38 in actual use.

Aforesaid probing apparatus 10 can be incorporated with two pick-and-place devices, which are not shown in the figures, for respectively picking up one of the DUTs 50 on the platforms after that DUT 50 has been tested and placing a new untested DUT 50 on an empty platform 26. In this way, a large quantity of DUTs 50 can be tested by the probing apparatus 10 automatically and continuously. It is more important that the heating device 40 provided by the present invention will not rotate along with the rotating device 20, so that the electric wires in the heating device 40 does not tend to break when the probing apparatus 10 works and a slip ring is also not required.

The probing apparatus 10 provided by the present invention may, but is not limited to, further comprise a thermal sensor 60 for sensing the temperature of the platform 26 at the test position P1 or the temperature of the DUT 50 located on the platform 26 at the test position P1 so as to ensure that the temperature of the DUT 50 probed by the prober 38 is not too low or too high. The thermal sensor 60 is fixed to the heating device 40 in this preferred embodiment, but not limited to that way as long as the thermal sensor 60 is fixed relative to the lifting stage 36 so as to move along with the lifting stage 36.

In the probing apparatus 10 provided by the present invention, the lifting stage 36 may, but is not limited to, comprise a seat body 362 fixed to the screw nut module 34, a buffering unit 364 as shown in FIG. 3 mounted to the seat body 362, and a connecting element 366 mounted to the buffering unit 364. The buffering unit 364 comprises two guiding pillars 364a mounted to the seat body 362, two coil springs 364b sleeved onto the guiding pillars 364a respectively, and a linear guide 364c mounted to the seat body 362. The connecting element 366 is mounted to the linear guide 364c for vertically sliding relative to the seat body 362 by means of the linear guide 364c. Besides, the connecting element 366 is provided with two stop portions 366a sleeved onto the guiding pillars 364a and abutting against an end of the springs 364b. In this way, the connecting element 366 is movable relative to the seat body 362 vertically and resiliently by means of the buffering unit 364. In addition, the heating device 40 is fixed to the connecting element 366 so that the buffering unit 364 will provide a buffering effect when the heating device 40 that is moved along with the lifting stage 36 to the second position P3 contacts the platform 26 at the test position P1, thereby preventing the aforesaid platform 26 from damages caused by impact.

Figure 7:
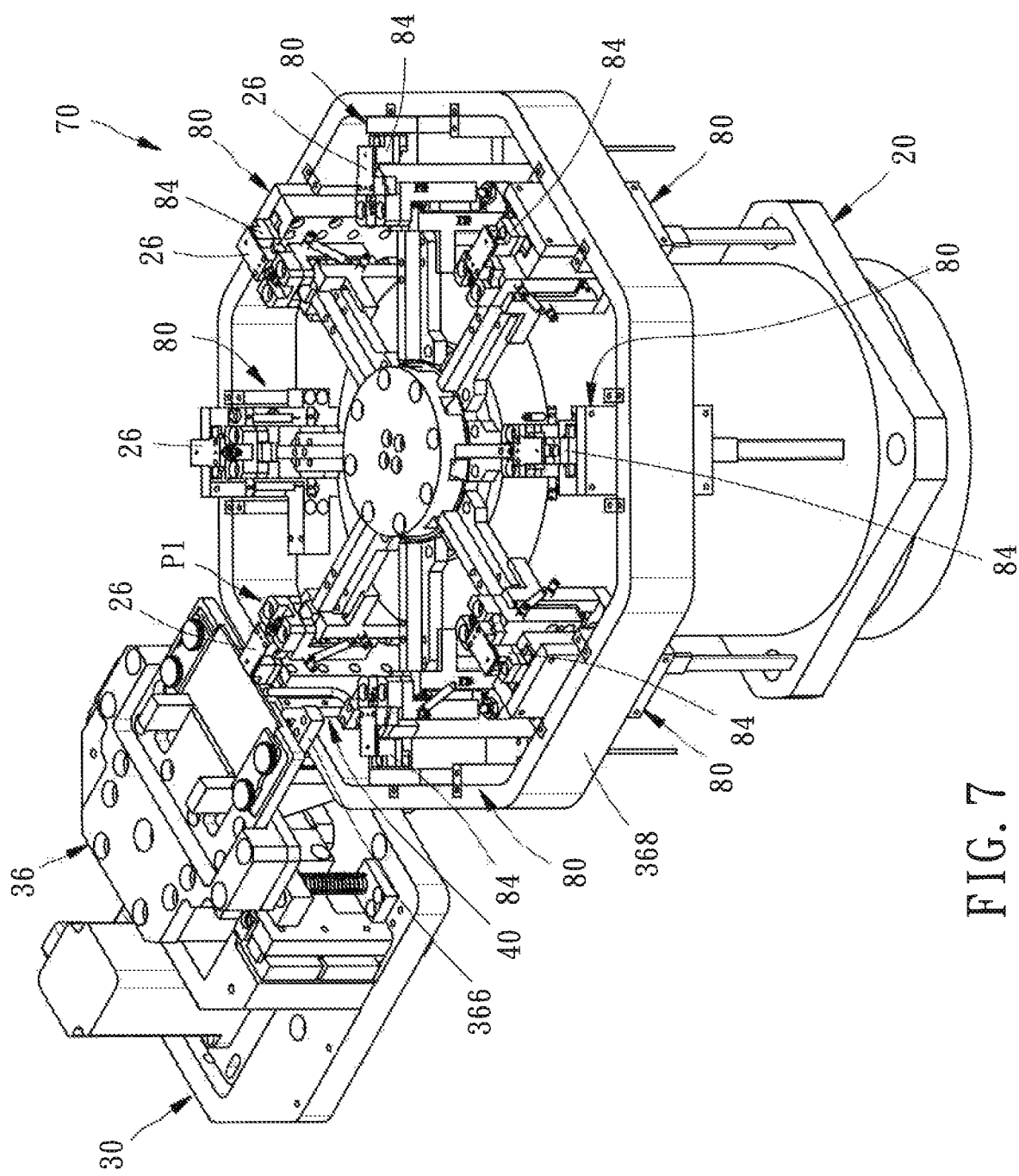
FIG. 7 is an assembled perspective view of a probing apparatus provided by a second preferred embodiment of the present invention.

FIG. 7 shows a probing apparatus 70 provided by a second preferred embodiment of the present invention. The probing apparatus 70 differs from aforesaid probing apparatus 10 in that the lifting stage 36 of the probe device 30 in the probing apparatus 70 further comprises an octangle annular frame 368 and the probing apparatus 70 further comprises seven auxiliary heating devices 80. The annular frame 368 is fixed to the connecting element 366 and encircles the rotating device 20. The heating device 40 is fixed to the annular frame 368 and located corresponding to the test position P1. The auxiliary heating devices 80 are fixed to the annular frame 368 and have the same structure with the heating device 40. When the lifting stage 36 is stayed at the second position P3, the bottom surface 264 of each platform 26 that is located away from the test position P1 is contacted with the top surface of the heat transfer element 84 of an auxiliary heating device 80 individually. In this way, the auxiliary heating devices 80 can preheat the platforms 26 located away from the test position P1 to prevent, each DUT 50 from insufficient temperature under testing. It is to be understood that the sum of the numbers of the heating device 40 and the auxiliary heating devices 80 is not limited to be equal to the amount of the platforms 26. The amount and the position of the auxiliary beating devices 80 can be adjusted according to user's requirement. The probing apparatus 70 can be configured having only one auxiliary heating device 80 in practice.

The invention being thus described, it will be obvious that the same may be varied in many ways. Such variations are not to be regarded as a departure from the spirit and scope of the invention, and all such modifications as would be obvious to one skilled in theart are intended to be included within the scope of the following claims.

What is claimed is:

1. A probing apparatus comprising:
   a rotating device having a plurality of platforms for supporting devices under test, the platforms being synchronously revolvable in a way that the platforms move to a test position sequentially;
   a probe device disposed at a location corresponding to the test position and provided with a lifting stage movable between a first position and a second position; and
   a heating device mounted to and moved along with the lifting stage of the probe device and configured in a way that the heating device is located away from the platform at the test position when the lifting stage moves to the first position and the heating device contacts and heats the platform at the test position when the lifting stage moves to the second position.

2. The probing apparatus as claimed in claim 1, further comprising a thermal sensor fixed relative to the lifting stage for sensing a temperature of the platform at the test position or a temperature of the device under test supported on the platform at the test position.

3. The probing apparatus as claimed in claim 1, wherein the lifting stage comprises a seat body, a buffering unit mounted to the seat body, and a connecting element mounted to the buffering unit; the connecting element is movable relative to the seat body vertically and resiliently through the buffering unit; the heating device is fixed to the connecting element.

4. The probing apparatus as claimed in claim 3, wherein the buffering unit comprises a guiding pillar mounted to the seat body, a spring sleeved onto the guiding pillar, and a linear guide mounted to the seat body; the connecting element is mounted to the linear guide and provided with a stop portion abutting against an end of the spring.

5. The probing apparatus as claimed in claim 4, wherein each said platform has a top surface, a bottom surface and a through hole penetrating through the top surface and the bottom surface; the heating device has a top surface, a side surface and a receiving notch opened on the top and side surfaces; the probe device further comprises a prober mounted to the lifting stage and provided with a probe needle received in the receiving notch of the heating device; when the lifting stage moves to the second position, the bottom surface of the platform at the test position is contacted with the top surface of the heating device and the probe needle is inserted into the through hole of the platform at the test position.

6. The probing apparatus as claimed in claim 3, wherein each said platform has a top surface, a bottom surface and a through hole penetrating through the top surface and the bottom surface; the heating device has a top surface, a side surface and a receiving notch opened on the top and side surfaces; the probe device further comprises a prober mounted to the lifting stage and provided with a probe needle received in the receiving notch of the heating device; when the lifting stage moves to the second position, the bottom surface of the platform at the test position is contacted with the top surface of the heating device and the probe needle is inserted into the through hole of the platform at the test position.

7. The probing apparatus as claimed in claim 1, wherein each said platform has a top surface, a bottom surface and a through hole penetrating through the top surface and the bottom surface; the heating device has a top surface, a side surface and a receiving notch opened on the top and side surfaces; the probe device further comprises a prober mounted to the lifting stage and provided with a probe needle received in the receiving notch of the heating device; when the lifting stage moves to the second position, the bottom surface of the platform at the test position is contacted with the top surface of the heating device and the probe needle is inserted into the through hole of the platform at the test position.

8. The probing apparatus as claimed in claim 1, further comprising at least one auxiliary heating device mounted to a frame of the lifting stage; wherein at least one of said platforms that is located away from the test position is contacted with said at least one auxiliary heating device when the lifting stage moves to the second position.

9. The probing apparatus as claimed in claim 8, wherein the lifting stage comprises a seat body, a buffering unit mounted to the seat body, and a connecting element mounted to the buffering unit; the connecting element is movable relative to the seat body vertically and resiliently through the buffering unit and fixed relative to the heating device and said at least one auxiliary heating device.

10. The probing apparatus as claimed in claim 9, wherein the buffering unit comprises a guiding pillar mounted to the seat body, a spring sleeved onto the guiding pillar, and a linear guide mounted to the seat body; the connecting element is mounted to the linear guide and provided with a stop portion abutting against an end of the spring.

11. The probing apparatus as claimed in claim 10, wherein each said platform has a top surface, a bottom surface and a through hole penetrating through the top surface and the bottom surface; the heating device and the auxiliary heating device each have a top surface and the heating device further has a side surface and a receiving notch opened on the side and top surfaces of the heating device; the probe device further comprises a prober mounted to the lifting stage and provided with a probe needle received in the receiving notch of the heating device; when the lifting stage moves to the second position, the bottom surface of the platform at the test position is contacted with the top surface of the heating device, the probe needle is inserted into the through hole of the platform at the test position, and the bottom surface of at least one said platform that is located away from the test position is contacted with the top surface of said at least one auxiliary heating device.

12. The probing apparatus as claimed in claim 9, wherein each said platform has a top surface, a bottom surface and a through hole penetrating through the top surface and the bottom surface; the heating device and the auxiliary heating device each have a top surface and the heating device further has a side surface and a receiving notch opened on the side and top surfaces of the heating device; the probe device further comprises a prober mounted to the lifting stage and provided with a probe needle received in the receiving notch of the heating device; when the lifting stage moves to the second position, the bottom surface of the platform at the test position is contacted with the top surface of the heating device, the probe needle is inserted into the through hole of the platform at the test position, and the bottom surface of at least one said platform that is located away from the test position is contacted with the top surface of said at least one auxiliary heating device.

13. The probing apparatus as claimed in claim 8, wherein each said platform has a top surface, a bottom surface and a through hole penetrating through the top surface and the bottom surface; the heating device and the auxiliary heating device each have a top surface and the heating device further has a side surface and a receiving notch opened on the side and top surfaces of the heating device; the probe device further comprises a prober mounted to the lifting stage and provided with a probe needle received in the receiving notch of the heating device; when the lifting stage moves to the second position, the bottom surface of the platform at the test position is contacted with the top surface of the heating device, the probe needle is inserted into the through hole of the platform at the test position, and the bottom surface of at least one said platform that is located away from the test position is contacted with the top surface of said at least one auxiliary heating device.

14. The probing apparatus as claimed in claim 8, wherein each said platform that is located away from the test position is contacted with one said auxiliary heating device individually when the lifting stage moves to the second position.

15. The probing apparatus as claimed in claim 14, wherein the frame of the lifting stage is an annular frame encircling the rotating device; the heating device and the at least one auxiliary heating device are fixed to the annular frame.

16. The probing apparatus as claimed in claim 15, wherein the lifting stage comprises a seat body, a buffering unit mounted to the seat body, and a connecting element mounted to the buffering unit; the connecting eletnent is movable relative to the seat body vertically and resiliently through the buffering unit; the annular frame is fixed to the connecting element.

17. The probing apparatus as claimed in claim 16, wherein the buffering unit comprises a guiding pillar mounted to the seat body, a spring sleeved onto the guiding pillar, and a linear guide mounted to the seat body; the connecting element is mounted to the linear guide and provided with a stop portion abutting against an end of the spring.

18. The probing apparatus as claimed in claim 17, wherein each said platform has a top surface, a bottom surface and a through hole penetrating through the top surface and the bottom surface; the heating device and the auxiliary heating device each have a top surface and the heating device further has a side surface and a receiving notch opened on the side and top surfaces of the heating device; the probe device further comprises a prober mounted to the lifting stage and provided with a probe needle received in the receiving notch of the heating device; when the lifting stage moves to the second position, the bottom surface of the platform at the test position is contacted with the top surface of the heating device, the probe needle is inserted into the through hole of the platform at the test position, and the bottom surface of each said platform that is located away from the test position is contacted with the top surface of one said auxiliary heating device.

19. The probing apparatus as claimed in claim 16, wherein each said platform has a top surface, a bottom surface and a through hole penetrating through the top surface and the bottom surface; the heating device and the auxiliary heating device each have a top surface and the heating device further has a side surface and a receiving notch opened on the side and top surfaces of the heating device; the probe device further comprises a prober mounted to the lifting stage and provided with a probe needle received in the receiving notch of the heating device; when the lifting stage moves to the second position, the bottom surface of the platform at the test position is contacted with the top surface of the heating device, the probe needle is inserted into the through hole of the platform at the test position, and the bottom surface of each said platform that is located away from the test position is contacted with the top surface of one said auxiliary heating device.

20. The probing apparatus as claimed in claim 15, wherein each said platform has a top surface, a bottom surface and a through hole penetrating through the top surface and the bottom surface; the heating device and the auxiliary heating device each have a top surface and the heating device further has a side surface and a receiving notch opened on the side and top surfaces of the heating device; the probe device further comprises a prober mounted to the lifting stage and provided with a probe needle received in the receiving notch of the heating device; when the lifting stage moves to the second position, the bottom surface of the platform at the test position is contacted with the top surface of the heating device, the probe needle is inserted into the through hole of the platform at the test position, and the bottom surface of each said platform that is located away from the test position is contacted with the top surface of one said auxiliary heating device.

* * * * *